United States Patent
Nijmeijer et al.

(10) Patent No.: US 7,280,228 B2
(45) Date of Patent: Oct. 9, 2007

(54) SYSTEM AND METHOD OF MEASUREMENT, SYSTEM AND METHOD OF ALIGNMENT, LITHOGRAPHIC APPARATUS AND METHOD

(75) Inventors: Gerrit Johannes Nijmeijer, Eindhoven (NL); Anastasius Jacobus Anicetus Bruinsma, Delft (NL); Christiaan Alexander Hoogendam, Veldhoven (NL); Jeroen Thomas Broekhuijse, Overpelt (NL); Sigurd Dressler, Obertiefenbach (DE); Edwin Eduard Nicolaas Josephus Krijnen, Oss (NL); Robbert Edgar Van Leeuwen, Eindhoven (NL); Roeland Nicolaas Maria Vanneer, Eindhoven (NL); Cornelis Christiaan Ottens, Veldhoven (NL)

(73) Assignee: ASML Netherlands B.V. (NL)

( * ) Notice: Subject to any disclaimer, the term of this patent is extended or adjusted under 35 U.S.C. 154(b) by 473 days.

(21) Appl. No.: 10/882,685

(22) Filed: Jul. 2, 2004

(65) Prior Publication Data
US 2005/0046845 A1 Mar. 3, 2005

(30) Foreign Application Priority Data
Jul. 2, 2003 (EP) .................................. 03077084

(51) Int. Cl.
*G01B 11/14* (2006.01)
(52) U.S. Cl. ..................................................... 356/614
(58) Field of Classification Search ................ 356/124, 356/399–402, 121, 614–615, 620, 62, 602, 356/622, 154

(56) References Cited

U.S. PATENT DOCUMENTS

| | | | |
|---|---|---|---|
| 5,898,453 A * | 4/1999 | Fischer et al. ............... 347/255 |
| 6,020,964 A | 2/2000 | Loopstra et al. |
| 6,172,997 B1 * | 1/2001 | Miyake et al. ................ 372/36 |
| 6,188,150 B1 | 2/2001 | Spence |
| 6,327,025 B1 | 12/2001 | Imai |
| 6,507,388 B2 | 1/2003 | Burghoorn |
| 6,977,713 B2 * | 12/2005 | Luttikhuis et al. ............ 355/30 |
| 7,105,836 B2 * | 9/2006 | del Puerto et al. ....... 250/492.2 |
| 7,135,679 B2 * | 11/2006 | Roman et al. .............. 250/331 |
| 2001/0006413 A1 | 7/2001 | Burghoorn |

(Continued)

FOREIGN PATENT DOCUMENTS

EP 1 111 473 A2 6/2001

(Continued)

OTHER PUBLICATIONS

Stiemerling, et al., "*NAT/Firewall NSIS Signaling Layer Protocol (NSLP)*", NSIS Working Group, May 21, 2004, pp. 1-52.

*Primary Examiner*—Tarifur Chowdhury
*Assistant Examiner*—Isiaka O Akanbi
(74) *Attorney, Agent, or Firm*—Pillsbury Winthrop Shaw Pittman LLP

(57) ABSTRACT

A lithographic apparatus includes a measurement system including at least one optical component and at least one electrical component. The electrical component is configured to dissipate heat. The optical component is mounted on a first frame of the apparatus, and the electrical component is mounted on a second frame of the apparatus that is thermally and mechanically decoupled from the first frame. An optical coupling is provided between the first frame and the second frame.

26 Claims, 4 Drawing Sheets

U.S. PATENT DOCUMENTS

2001/0011712 A1* 8/2001 Castenmiller et al. ...... 250/548
2003/0095241 A1   5/2003 Burghoorn
2003/0117600 A1   6/2003 Taniuchi et al.
2004/0156049 A1* 8/2004 Breninger et al. .......... 356/364
2004/0184014 A1* 9/2004 Bakker et al. ................ 355/30
2004/0263846 A1* 12/2004 Kwan ......................... 356/399

FOREIGN PATENT DOCUMENTS

EP           1 111 473 A3      4/2004
WO    WO 2004/001520 A2      12/2003

* cited by examiner

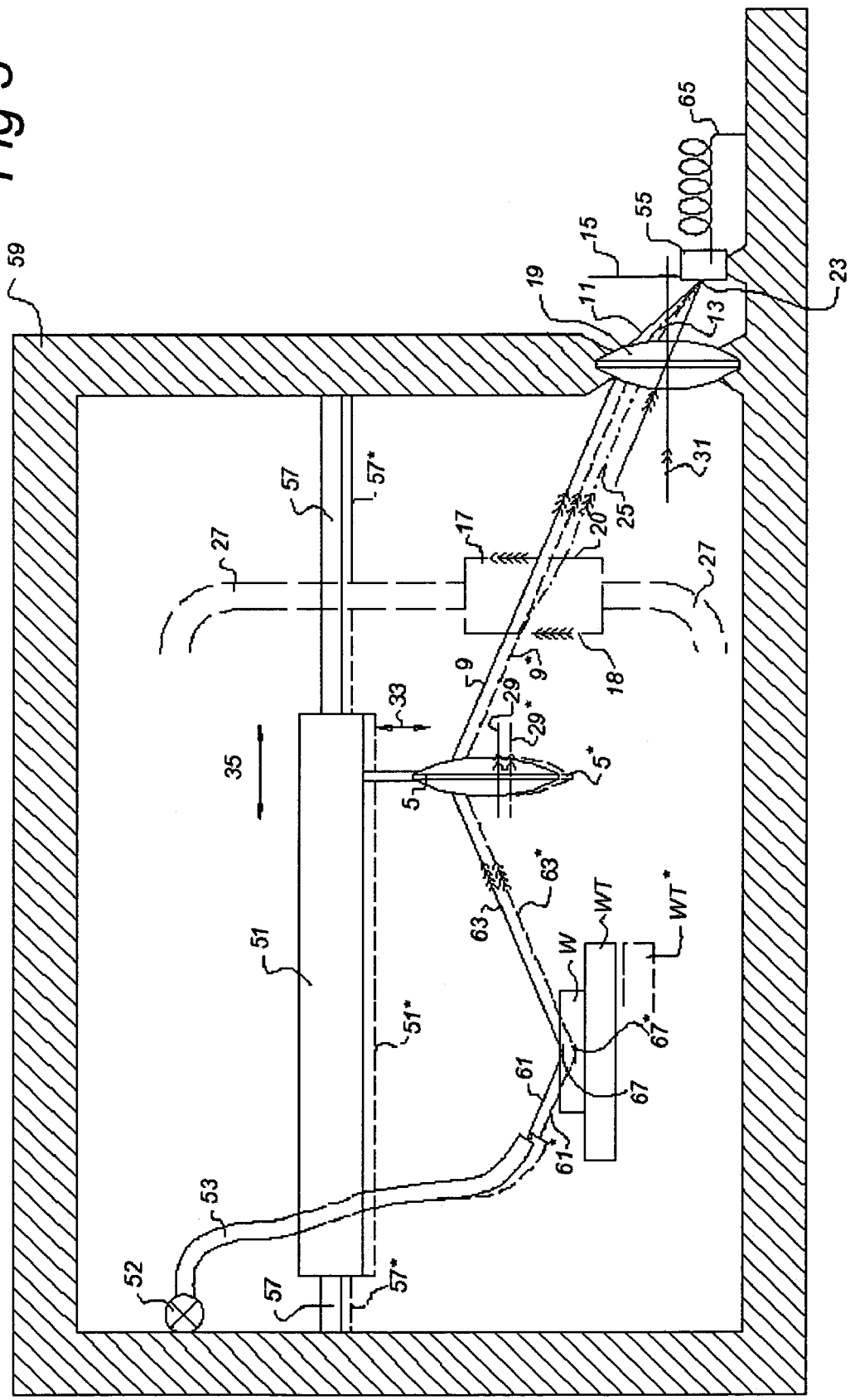

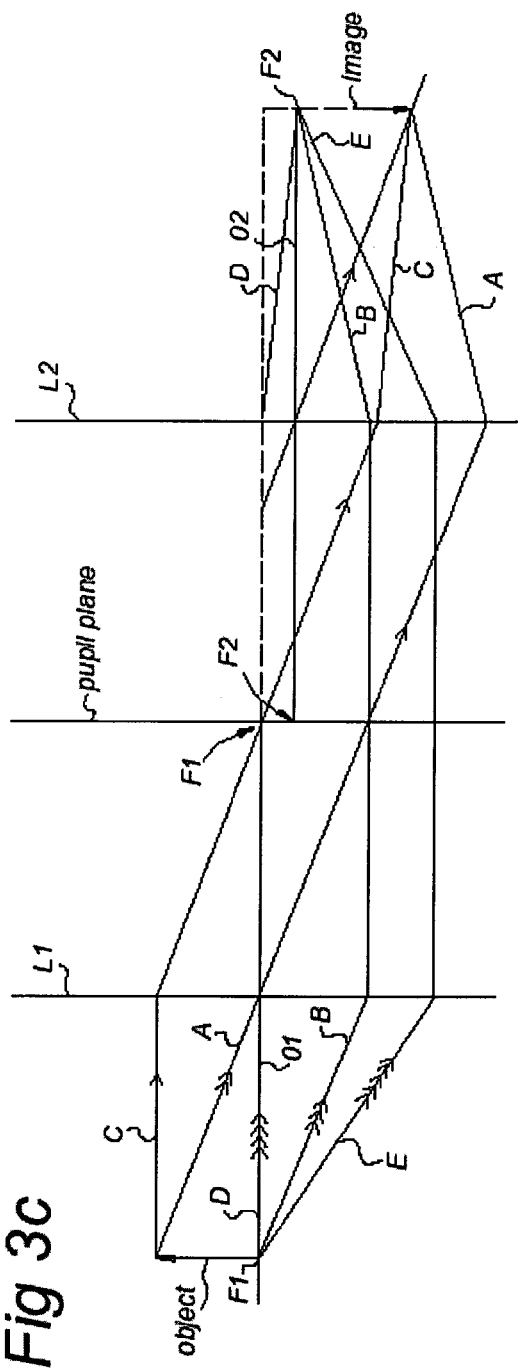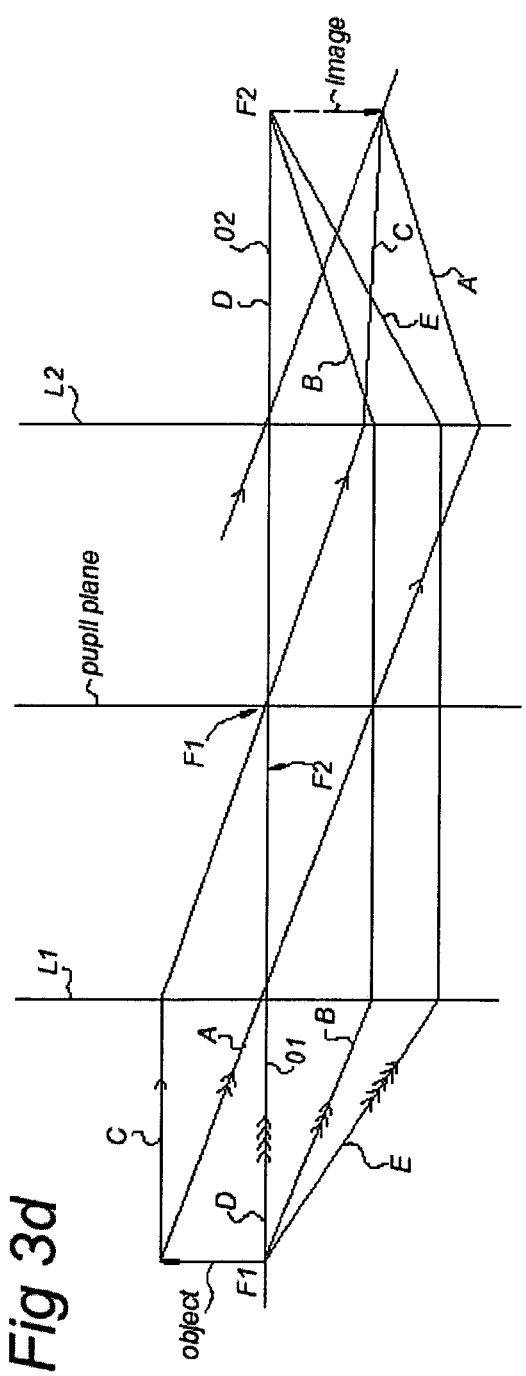

SYSTEM AND METHOD OF MEASUREMENT, SYSTEM AND METHOD OF ALIGNMENT, LITHOGRAPHIC APPARATUS AND METHOD

RELATED APPLICATION

This application claims priority to European Patent Application No. 03077084.6, filed Jul. 2, 2003, herein incorporated by reference in its entirety.

FIELD OF THE INVENTION

The invention relates to lithographic apparatus and methods.

BACKGROUND

The term "patterning structure" as employed herein should be broadly interpreted as referring to a structure that can be used to endow an incoming radiation beam(or particle beam) with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the patterning structure can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as herein set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper or step-and-repeat apparatus. In an alternative apparatus—commonly referred to as a step-and-scan apparatus—each target portion is irradiated by progressively scanning the mask pattern under the beam of radiation in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components according to any of these design types configured to direct, shape or control the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

In a lithographic projection apparatus, a measurement system, such as a level sensor or alignment sensor, may include optical components and electrical components mounted on a frame. The optical components may be used to determine the properties of a substrate ("wafer") on a wafer table and/or a topography of the wafer. Electrical components (e.g. detectors) convert optical information to a representative measurement signal. Electrical components, during operation, may generate heat. Heat may cause a frame on which optical and electrical components are mounted ("metrology" frame), as is typically the case, to deform. Deformation of the frame may severely jeopardize the accuracy of a measurement. In addition, the electrical components may take up a lot of room on the metrology frame. Also, the more components on the metrology frame are present, the more potential sources of contamination (e.g. from outgassing).

Two separate frames (metrology frame, and second or "base" frame) may also move relative to each other. As such, a relative movement can cause the amount of optical signal (e.g. amount of optical power) from the metrology frame incident on a detector on the base frame to change, such that the movement may directly result in an error in the position measurement of the wafer. Crosstalk may occur as well.

SUMMARY

A lithographic apparatus according to one embodiment of the invention includes a radiation system configured to form a beam of radiation from radiation emitted by a radiation source; a support structure constructed and arranged to hold a patterning structure, the patterning structure configured to pattern a beam of radiation according to a desired pattern; a substrate table constructed and arranged to hold a substrate; a projection system constructed and arranged to project the patterned beam of radiation means onto a target portion of the substrate; and a measurement system including at least one optical component and at least one electrical component. The at least one optical component is mounted on a first frame, and the at least one electrical component is mounted on a second frame substantially thermally and mechanically decoupled from the first frame.

Another embodiment of the invention includes a lithographic projection apparatus with a measurement system relatively insensitive to translational movements between the base frame and the metrology frame.

In a further embodiment, an optical coupling is provided between the first frame and the second frame. In at least some applications of such an embodiment, a system less sensitive to relative movements may result.

In yet another embodiment of the invention, a method of manufacturing an integrated structure by a lithographic process includes providing a substrate that is at least partially covered by a layer of radiation-sensitive material; providing a projection beam of radiation using a radiation system; using a patterning structure to endow the projection beam with a pattern in its cross-section; and projecting the patterned beam of radiation onto a target portion of the layer of radiation-sensitive material. The method includes using a lithographic projection apparatus that includes a first frame and a measurement system including at least one optical component and at least one electrical component in operation dissipating heat. The at least one optical component is located on the first frame, and the at least one electrical component is mounted on a second frame substantially thermally and mechanically decoupled from the first frame.

In an embodiment of the invention, there is provided a method of manufacturing an integrated structure including providing a beam of radiation using a radiation system; patterning the beam of radiation with a pattern in its cross-section; and projecting the patterned beam of radiation onto a target portion of a layer of radiation-sensitive material on a substrate in a lithographic projection apparatus. The lithographic projection apparatus includes a measurement system including at least one optical component and at least one electrical component configured to dissipate heat. The at least one optical component is located on the first frame, and the at least one electrical component is mounted on a second frame substantially thermally and mechanically decoupled from the first frame.

In yet another embodiment of the invention, a measurement system includes a first optical element connected to a first frame; a second optical element connected to a second frame, and a detector configured to detect an image transmitted through the first and the second optical element. The first frame is mounted on the second frame, and the first optical element and the second optical element are in optical relationship such that a position of the image on the detector is not affected by translation movements of the first frame relative to the second frame.

In an embodiment of the invention, there is provided a lithographic projection apparatus including a radiation system configured to provide a beam of radiation; a patterning structure configured to pattern the beam of radiation according to a desired pattern; a substrate table configured to hold a substrate; a projection system configured to project the beam of radiation onto a target portion of the substrate; and a measurement system configured to measure a topography of the substrate. The measurement system includes a first optical element connected to a first frame; a second optical element connected to a second frame, and a detector configured to detect an image transmitted through the first and the second optical element. The first frame is mounted on the second frame, and the first optical element and the second optical element are in optical relationship such that a position of the image on the detector is not affected by translation movements of the first frame relative to the second frame.

A method of alignment according to an embodiment of the invention includes using a table to movably support a substrate; directing a beam at a principal surface of the substrate; and using an optical path to direct a reflection of the beam at an electrical component. The optical path includes at least one optical element attached to a first frame, and the electrical component is substantially thermally and mechanically isolated from the first frame.

BRIEF DESCRIPTION OF THE DRAWINGS

The invention will now be explained in connection with the accompanying drawings, which are only intended to show examples and not to limit the scope of protection, and in which.

DETAILED DESCRIPTION

Figure 1:
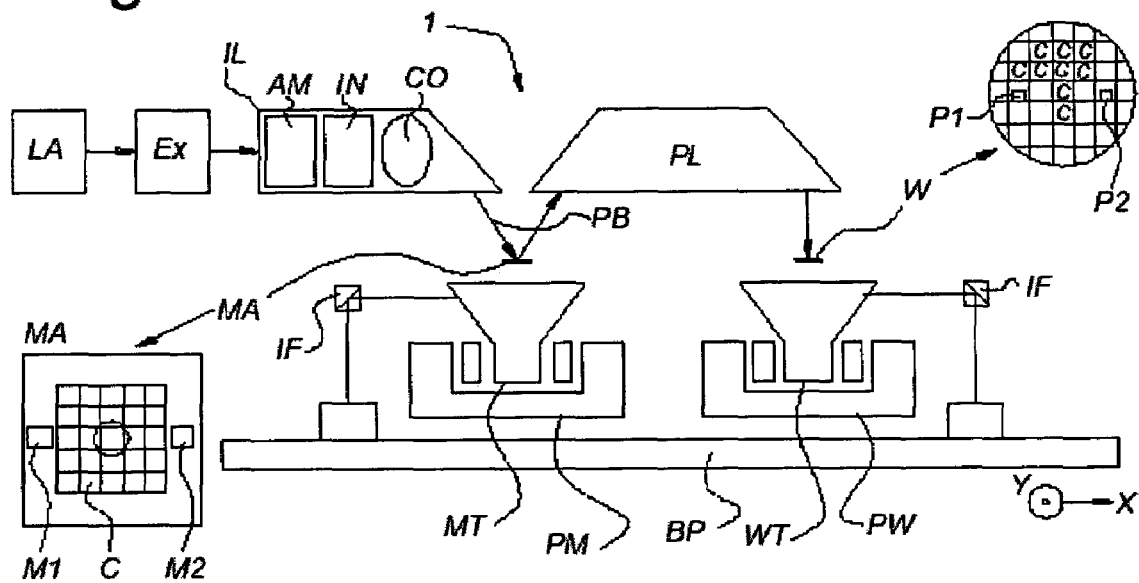
FIG. 1 represents a schematic general overview of a lithographic projection apparatus according to an embodiment of the invention.

FIG. 1 schematically depicts a lithographic projection apparatus 1 according to an embodiment of the invention. The apparatus includes a radiation system Ex, IL, configured to supply a beam PB of radiation, which may include one or more of all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm). In this particular case, the radiation system also includes a radiation source LA. The apparatus also includes a first object table (mask table) MT provided with a mask holder configured to hold a mask MA (e.g. a reticle), and connected to first positioning device PM configured to accurately position the mask with respect to the projection system ("lens"), item PL; and a second object table (substrate table) WT provided with a substrate holder configured to hold a substrate W (e.g. a resist-coated silicon wafer), and connected to second positioning device PW configured to accurately position the substrate with respect to the projection system ("lens"), item PL. The apparatus further includes a projection system ("lens") PL configured to image an irradiated portion of the mask MA onto a target portion C (e.g. including one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a laser-produced plasma or a discharge plasma EUV radiation source) produces a beam of radiation. This beam is fed into an illumination system (illuminator) IL, either directly or after having traversed a conditioning structure, such as a beam expander Ex, for example. The illuminator IL may include an adjusting structure AM configured to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes, for example:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution. Combinations of these modes may also be applied.

Figure 2:
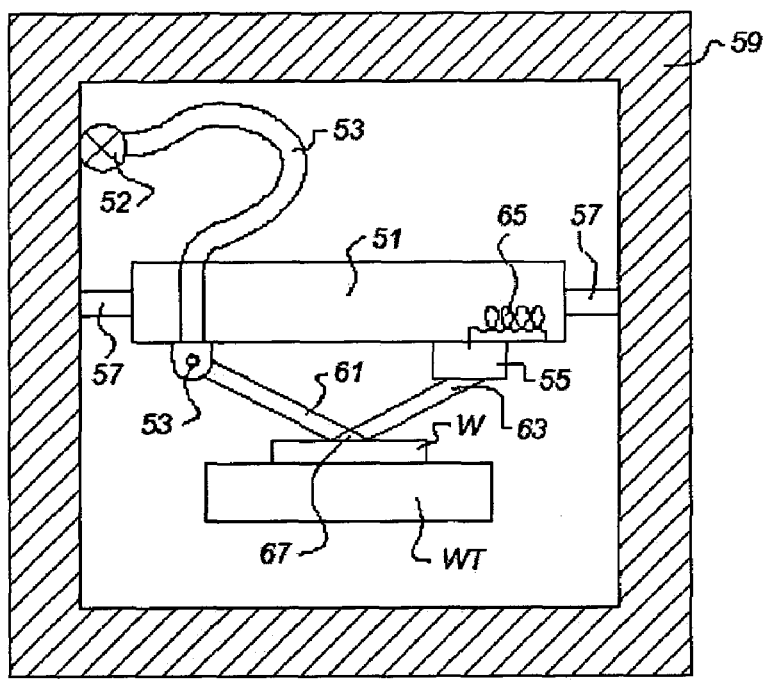
FIG. 2 is a schematic representation of a conventional measurement system.

FIG. 2 shows the wafer table WT of FIG. 1 with the wafer W. The equipment around the wafer table WT is also shown in more detail. A ray of light 61 from a fiber 53 supplied by a light source 52 hits the surface of the wafer W in one or more measurement spots 67. The ray of light 61, in this example, serves as a measurement beam used by a level sensor, as will be known to the skilled person. A reflected ray 63 becomes incident on a sensor 55. A cooling element 65 may be connected to the sensor 55. The sensor 55 and the cooling element 65 may be located on a frame 51, also called "metrology frame". The metrology frame is supported via a support 57 mounted to a second frame or "base frame" 59. Mechanical decoupling may be made by airmount, servo controlled damping device or by other devices as may present themselves to a person skilled in the art. In this example, the position of fiber 53 relative to the metrology frame 51 is fixed.

With this setup, the electrical components, such as the sensor 55 and the cooling element 65 may produce heat, which may cause the metrology frame 51 to deform and may introduce errors in the measurement as carried out by the sensor 55.

In FIG. 3, which shows an embodiment of the invention, the metrology frame 51 is shown again. In this example, the position of the wafer table WT relative to the metrology frame is measured in six degrees of freedom by interferometers mounted on the metrology frame 51. On the basis of the measurement signals generated by the interferometers, a servo (not shown) keeps the wafer table WT effectively in a fixed position relative to the metrology frame 51.

A first lens 5 is connected to the metrology frame 51. The first lens 5 has an optical axis 29. Parallel to the optical axis 29 of the first lens 5 is an optical axis 31 of a second lens 19. Note, however, that the invention is not limited to a lens 19 with its optical axis 31 parallel to the optical axis 29 of the lens 5. Principles of the invention may be applied equally well to a lens 19 having its optical axis 31 at an angle to the optical axis 29.

The second lens 19 is connected to the base frame 59. A ray of light from the measurement spot 67, which is located in the focal plane of the first lens 5, is shown divided in three parts. The part from the measurement spot 67, as shown in FIG. 2 (although in FIG. 3 this ray is shown with a single line), to the lens 5 is denoted by reference numeral 63. The part between the first lens 5 and the second lens 19 is denoted by reference numeral 9. The part after the ray of light has passed the second lens 19 is denoted by reference numeral 11.

The lens 19 has a focal plane 15. The ray of light from the measurement spot 67 intersects the focal plane 15 of the second lens 19 in an image point 23. In this example, the image point 23 is located on the detector 55. A line 25 parallel to the part 9 of the ray of light is shown to illustrate the construction of the image point 23 as will be appreciated by a skilled person. As previously mentioned, more than one measurement spot 67 may be present.

When due to some error, the metrology frame 51 makes a translational movement with respect to the optical axis 31 of the second lens 19 (as indicated by an arrow 33 and 35 in FIG. 3), the ray of light 61, 63 and 9 and the measurement spot 67 may move accordingly. Such an effect is indicated in FIG. 3 for a movement substantially perpendicular to the optical axis 31 along the arrow 33, by reference numerals with an asterisk (*). However the part of the ray of light 11 after the second mirror 19 may not undergo a parallel displacement. Rather this part, indicated by 13, may still pass through the image point 23 and reach the detector 55.

Figure 3A:
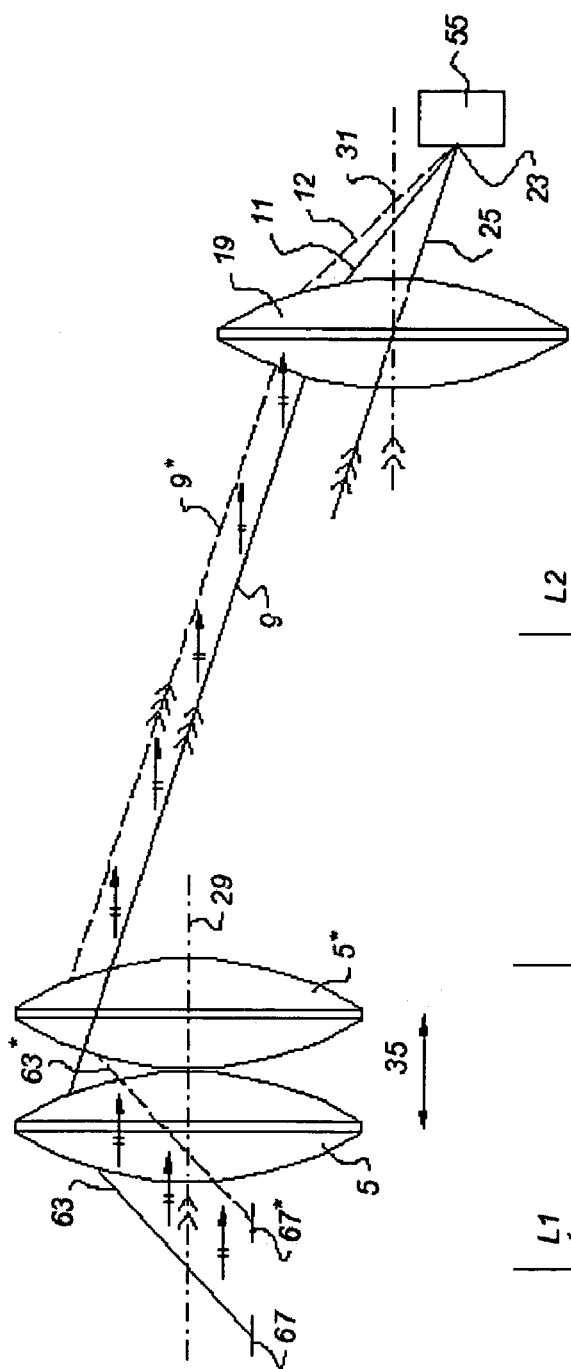
FIG. 3a illustrates a particular type of movement in the detection system of FIG. 3, FIGS. 3b, 3c and 3d show a schematic representation of a lens arrangement of the detection system according to several embodiments of the invention.

In FIG. 3a, the situation is shown for a movement of the frame 51 relative to the frame 59 substantially parallel to the optical axis 31, along the direction indicated by the arrow 35. In this example, this movement also will lead to a displacement of the measurement spot 67, and the parts of the ray labeled by 63 and 9. However the part of the ray of light 11 after the second mirror 19 will not undergo a parallel displacement. This part, indicated by 12, will still pass through the image point 23 and reach the detector 55. A system as disclosed in FIGS. 3 and 3a is thus relatively insensitive to movements parallel and/or perpendicular to the optical axis 29 and 31 (and/or movements which can be decomposed in a movement parallel and a movement perpendicular to the optical axis 29 and 31) and provides for a measurement system in which heat-generating components are placed outside the metrology frame 51 to reduce heat problems and is relatively insensitive to translational movements between the frame 51 and the frame 59.

Although principles of the invention have been explained for a system in which the optical axes 29 and 31 are substantially parallel, the invention applies equally well to a system in which the optical axes 29 and 31 are at an angle to each other. For example, it will be appreciated that during the movement of the metrology frame 51 relative to the base frame 59, the mutual angular orientation of the metrology frame 51 relative to the base frame 59 remains the same.

In an embodiment of the invention, the metrology frame 51 is enclosed in a vacuum chamber with walls 27 shown with dashed lines in FIG. 3. The walls 27 may have transparent parts, such as shown by reference numeral 17, having a left side 18 and a right side 20. In such an embodiment, the part 9 of the ray of light may undergo a parallel displacement (dashed) and still reach the detector 15 albeit under a different angle than previously. It will be appreciated that by inserting the wall 17, the amount of light reaching the detector 55 may remain substantially unaffected, e.g. as long as the sides 18 and 20 are parallel.

Figure 3B:
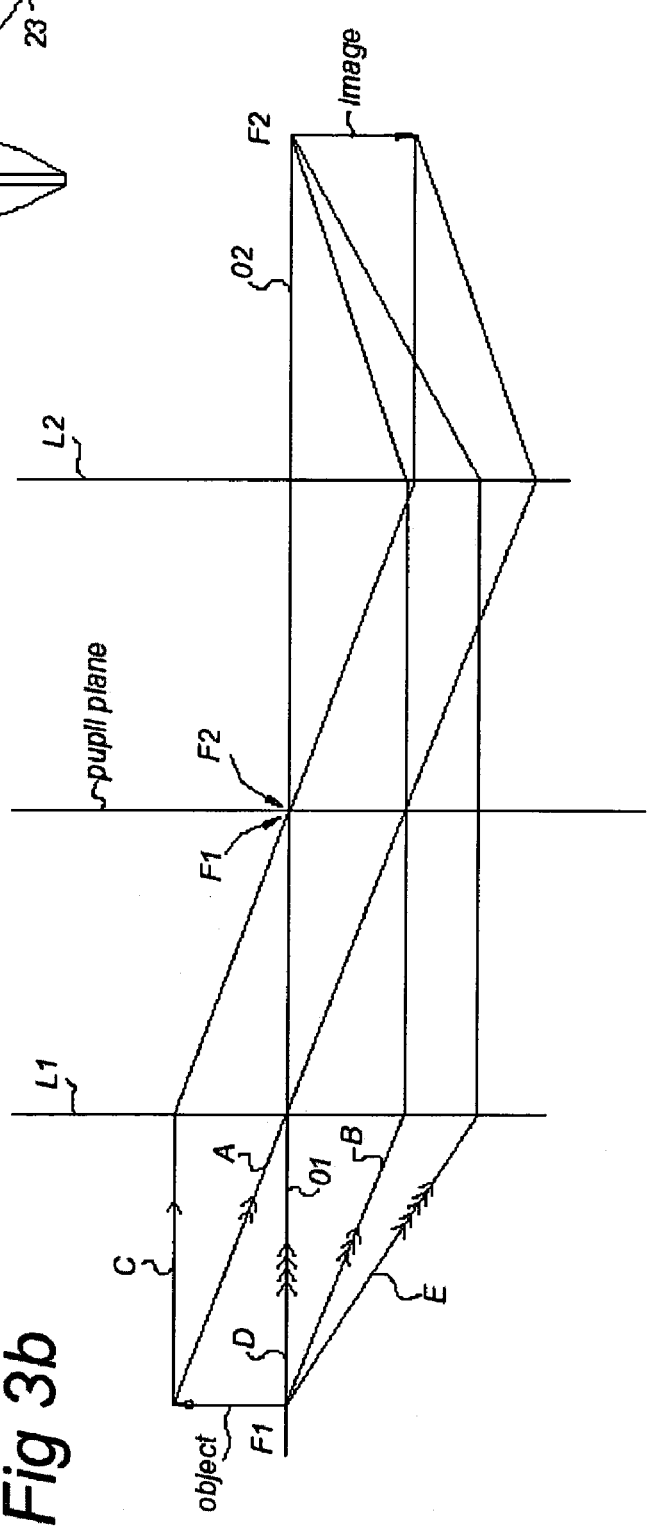
FIG. 3 is a schematic representation of a measurement system according to a an embodiment of the invention.

Additional embodiments of the invention are further explained with the aid of FIGS. 3b, 3c and 3d.

In FIG. 3b, a first lens L1 an a second lens L2 are shown. The foci and the optical axes of the lenses L1 and L2 are denoted by F1 and F2 and O1 and O2, respectively. Also shown are an object in front of the first lens L1 and an image behind the second lens L2. In a particular embodiment as shown in FIG. 3b, the optical axes O1 and O2 of the lenses L1 and L2 coincide, as do their focal planes. However, it will be appreciated that it is not essential that the optical axes and focal planes coincide.

The plane at which the focal planes of the lenses coincide is the pupil plane. The pupil plane is indicated in FIG. 3b. The definition of the pupil plane, which is a well known term in optics, is as follows: all rays of a given angle at the object have the same position in the pupil plane, and all rays of a given position at the object have the same angle in the pupil plane. Referring to FIG. 3b, this figure shows a first ray A and a second ray B which leave an object at the same angle.

It can be seen that at the pupil plane the rays cross (i.e. are at the same position in the pupil plane). Ray A, and a further ray C leave the object from the same position. These rays have the same angle at the pupil plane. The latter also applies to the ray B, and further rays D and E, although they strike the pupil plane at an angle of 90 degrees.

The angle of the rays is not affected by the insertion of a window in the pupil plane. This means that the image is not affected by the insertion of the window (the position at the image depends only on the angle at the pupil plane). Similarly, translation or rotation of the window will not change the angle of the rays, and so will not affect the image. It will be appreciated that is not essential that the window be located in the pupil plane. In an embodiment of the invention, the window may be at any point between the lenses L1 and L2. Referring to FIG. 3b, moving the window to the left or to the right will not affect the angles of the rays, and so will not affect the image. However, it may be desirable that the window be flat and that any non-flat optical element not be present between the window and the pupil plane (e.g. any element with an optical power) in at least some embodiments of the invention.

It will be appreciated that, as mentioned above, the movement of the window does not affect the image. It will also be appreciated that a lateral movement of the lens L2 relative to L1 (i.e. movement perpendicular to the optical axis) does not affect the image. This is demonstrated in FIG. 3c, in which the same reference numerals are used as in FIG. 3b.

In FIG. 3c, lens L2 has moved downwards. The optical axis O2 of the lens is translated with the lens L2 (by definition it moves with the lens L2). The image is formed at the same location relative to the optical axis O2 of the lens L2. It will be appreciated that in such a configuration, the detector used to detect the image may be moved with the lens L2. It should be understood that the focal lengths of the lenses L1 and L2 may not be the same.

It will be appreciated that a parallel movement of the lens L2 relative to L1 (i.e. movement parallel to the optical axis) does not affect the image. This is demonstrated in FIG. 3d in which the same reference numerals are used as in FIG. 3b.

In FIG. 3d, lens L2 has moved towards lens L1. The image is formed at the same location relative to the optical axis O2 of the lens L2. It should be understood that the focal lengths of the lenses L1 and L2 may not be the same.

It will also be appreciated that a movement that can be decomposed in intervals in which the optical axis O2 of lens L2 does not change its angular orientation with respect to the optical axis O1, also does not affect the image.

It will be appreciated that references to the movement of lens L2 are intended to mean movement relative to lens L1. Since such principles of the invention relate to relative movement, it will be appreciated that equivalently lens L1 may move relative to lens L2.

It should be understood that the optical axes O1 and O2 of the lenses L1 and L2 may not be parallel. Indeed, one or both of the lenses may be tilted, for example to stop reverse coupling of light which is reflected from surfaces of the lenses.

In at least some embodiments, the amount of electrical components present on the metrology frame may be reduced as compared to existing system. Other potential advantages that may be obtained include substantially less heat generating components in thermal contact with the metrology frame, which may give a reduction in deformation and contamination problems.

In a further embodiment, the optical coupling includes an assembly of at least a first lens mounted on the first frame and at least a second lens mounted on the second frame. The optical coupling is made with an assembly of a first "image" lens located on the metrology frame, optionally with its optical axis parallel to the optical axis of a second positive "detector" lens located on the base frame. When a detector remains located in a fixed point of the focal plane of the detector lens, a strictly translational movement of the optical axes of the lenses with respect to each other will result in a change in the angle under which a ray of light from the image exits from the detector lens and reaches the detector. However, this exiting ray will still pass through the focal point where the detector is located. In this way, the frames may move relative to each other without affecting the power of the light signal incident at the detector. The assembly may include more than two lenses in an embodiment of the invention.

In a further embodiment of the invention, a lithographic apparatus as described above includes an assembly including a pupil plane wherein the first frame is embedded in a closed chamber with a wall, which wall includes a transparent window and no elements with optical power are arranged between the pupil plane and the window. An element with no optical power of the element refers to an element that does not change the mutual angular orientation of rays of light entering this optical element. The transparent window is located in between the first lens and the second lens. This will only causes a planar parallel displacement of a ray of light passing through the window. Any parallel displacement of a ray of light however, will only affect the angle under which the ray hits the focal plane behind the second lens. Any electronic device such as for instance a detector receive, however, the same amount of optical power. By embedding the first frame in a closed chamber with a transparent window, the first frame may be less susceptible to external influences (contamination, among others) while the optical signal generated may at the same time easily pass through the window to the world outside the chamber.

In a further embodiment of the invention, a first pressure is present inside the closed chamber and a second pressure is present outside the closed chamber. This is in particular useful in lithographic apparatus that are meant to work with EUV radiation, which need a "metrology frame" under (high) vacuum conditions. On the other hand, atmospheric conditions may be desirable to ensure an adequate removal of the heat generated by electrical components. Comparable requirements with respect to vacuum conditions apply to lithographic apparatus working with electron beams, ion beam, X-ray radiation, etc.

While specific embodiments of the invention have been described above, it will be appreciated that the invention may be practiced otherwise than as described. Methods as described herein may also be implemented as software, firmware, hardware, or some combination of these (e.g. in the form of one or more sets of machine-executable instructions stored on a data storage medium such as a disk or computer memory). In an embodiment, there is provided a computer program comprising program code that, when executed on a computer system, instructs the computer system to perform any or all of the methods described herein. The description is not intended to limit the invention.

What is claimed:

1. A lithographic projection apparatus comprising:
   a radiation system configured to form a beam of radiation;
   a support structure constructed and arranged to hold a patterning structure, the patterning structure being configured to pattern the beam of radiation;
   a substrate table constructed and arranged to hold a substrate;
   a projection system constructed and arranged to project the patterned beam of radiation onto a target portion of the substrate; and
   a measurement system configured to measure a position of at least a portion of the substrate, said measurement system comprising at least one optical component adapted to receive light from a source and at least one electrical component, the at least one optical component being mounted on a first frame, wherein the at least one electrical component is mounted on a second frame substantially thermally and mechanically decoupled from the first frame.

2. A lithographic projection apparatus according to claim 1, wherein an optical coupling is provided between said first frame and said second frame.

3. A lithographic projection apparatus according to claim 2, wherein the optical coupling comprises an assembly of at least a first lens mounted on the first frame and at least a second lens mounted on the second frame.

4. A lithographic projection apparatus according to claim 3, wherein the assembly comprises a pupil plane, and
   wherein said first frame is embedded in a closed chamber with a wall, said wall comprising a transparent window, and
   wherein an optical power of an operative optical path of the measurement system between the pupil plane and the window is substantially zero.

5. A lithographic projection apparatus according to claim 4, wherein the window is arranged in the pupil plane.

6. A lithographic projection apparatus according to claim 4, wherein a first pressure is present within said closed chamber, and
   wherein a second pressure different than the first pressure is present at an exterior of said closed chamber.

7. A method of manufacturing an integrated structure comprising:
   projecting a patterned beam of radiation onto a target portion of a layer of radiation-sensitive material on a substrate in a lithographic projection apparatus; and
   using a measurement system of the lithographic projection apparatus to measure a position of at least a portion of the substrate,
   wherein the measurement system comprises at least one optical component and at least one electrical component configured to dissipate heat, the at least one optical component being located on said first frame, and
   wherein the at least one electrical component is mounted on a second frame substantially thermally and mechanically decoupled from the first frame.

8. A measurement system comprising:
   a first optical element connected to a first frame;
   a second optical element connected to a second frame, and
   a detector configured to detect an image transmitted through said first and said second optical element,
   wherein said first frame is mounted on said second frame, and
   wherein said first optical element and said second optical element are in optical relationship such that a position of said image on said detector is substantially invariant to translation of said first frame relative to said second frame.

9. A measurement system according to claim 8, wherein said first and said second optical element are lenses.

10. A measurement system according to claim 8, wherein said second frame at least partially encloses said first frame.

11. A measurement system according to claim 8, wherein an optical axis of said first optical element is parallel to an optical axis of said second element.

12. A measurement system according to claim 8, wherein said detector is positioned at a focal plane of said second optical element.

13. A measurement system according to claim 8, wherein a window is interposed between said first and said second optical element.

14. A measurement system according to claim 13, wherein said window has a substantially flat profile.

15. A measurement system according to claim 8, wherein a focal plane of said first optical element coincides with a focal plane of said second optical element.

16. A measurement system according to claim 10, wherein a pressure inside said second frame is different from a pressure at an exterior of said second frame.

17. A lithographic projection apparatus comprising:
   a radiation system configured to form a beam of radiation;
   a patterning structure support configured to support a patterning structure, the patterning structure being configured to pattern said beam of radiation;
   a substrate table configured to hold a substrate;
   a projection system configured to project said patterned beam of radiation onto a target portion of said substrate; and
   a measurement system configured to measure a topography of said substrate, said measurement system including:
      a first optical element connected to a first frame;
      a second optical element connected to a second frame, and
      a detector configured to detect an image transmitted through said first and said second optical element,
      wherein said first frame is mounted on said second frame, and
      wherein said first optical element and said second optical element are in optical relationship such that a position of said image on said detector is substantially invariant to translation of said first frame relative to said second frame.

18. A lithographic projection apparatus according to claim 17, wherein an optical axis of said first optical element is parallel to an optical axis of said second element.

19. A lithographic projection apparatus according to claim 17, wherein said detector is positioned at a focal plane of said second optical element.

20. A lithographic projection apparatus according to claim 17, wherein said second frame at least partially encloses said first frame.

21. A method of alignment, said method comprising:
   movably supporting a substrate;
   directing a beam at a principal surface of the substrate; and
   directing a reflection of the beam along an optical path to an electrical component,
   wherein the optical path includes at least one optical element attached to a first frame, and wherein the electrical component is substantially thermally and mechanically isolated from the first frame.

22. The method of alignment according to claim 21, wherein said electrical component is configured to output a signal representative of an image of the reflection.

23. The method of alignment according to claim 22, said method comprising determining, based on the signal, a position of at least a portion of the substrate in a direction perpendicular to the principal surface.

24. The method of alignment according to claim 23, said method comprising:

patterning a beam of radiation with a pattern in its cross-section; and projecting the patterned beam of radiation onto a target portion of a layer of radiation-sensitive material on a substrate, wherein said projecting is based on said determined position.

25. The method of alignment according to claim 21, wherein the optical path includes a window, and wherein an atmospheric pressure is substantially different at one side of the window with respect to an atmospheric pressure at the other side of the window.

26. The method of alignment according to claim 21, wherein a position of the reflection on the electrical component is substantially invariant to translation of the at least one optical element with respect to the electrical component.

* * * * *